United States Patent
Holzapfel et al.

(10) Patent No.: US 10,315,601 B2
(45) Date of Patent: Jun. 11, 2019

(54) CAPACITIVE OCCUPANT CLASSIFICATION SENSOR WITH LOAD-DEPENDENT ANTENNA AREA

(71) Applicant: IEE INTERNATIONAL ELECTRONICS & ENGINEERING S.A., Echternach (LU)

(72) Inventors: Erik Holzapfel, Prum (DE); Kwangbok Park, Gyeonggi-do (KR)

(*) Notice: Subject to any disclaimer, the term of this patent is extended or adjusted under 35 U.S.C. 154(b) by 0 days.

(21) Appl. No.: 16/072,475

(22) PCT Filed: Jan. 16, 2017

(86) PCT No.: PCT/EP2017/050808
§ 371 (c)(1),
(2) Date: Jul. 24, 2018

(87) PCT Pub. No.: WO2017/129433
PCT Pub. Date: Aug. 3, 2017

(65) Prior Publication Data
US 2018/0370475 A1    Dec. 27, 2018

(30) Foreign Application Priority Data

Jan. 25, 2016   (LU) .......................................... 92957

(51) Int. Cl.
*G01R 27/26*   (2006.01)
*B60R 21/015*   (2006.01)
(Continued)

(52) U.S. Cl.
CPC ........ *B60R 21/01532* (2014.10); *B60N 2/002* (2013.01); *B60R 21/01556* (2014.10);
(Continued)

(58) Field of Classification Search
CPC .... G01R 27/2605; G01R 27/26; G01R 27/00; G06F 3/0428; G06F 3/044; G01L 21/30;
(Continued)

(56) References Cited

U.S. PATENT DOCUMENTS

| | | |
|---|---|---|
| 7,180,306 B2 | 2/2007 | Stanley et al. |
| 8,022,834 B2 | 9/2011 | Fischer |

(Continued)

FOREIGN PATENT DOCUMENTS

| | | |
|---|---|---|
| EP | 1065097 A1 | 1/2001 |
| EP | 2062789 A1 | 5/2009 |

(Continued)

OTHER PUBLICATIONS

International Search Report on International application No. PCT/EP2017/050808, dated Jan. 15, 2017, 4 pages.

(Continued)

*Primary Examiner* — Huy Q Phan
*Assistant Examiner* — Raul J Rios Russo
(74) *Attorney, Agent, or Firm* — Reising Ethington P.C.

(57) ABSTRACT

A capacitive sensor member of a vehicle seat occupant detection and classification device that includes a first electrically conductive antenna member and at least a second electrically conductive antenna member that is adjacently arranged to the first electrically conductive antenna member without any mutual galvanic connection. At least one electrically conductive bridging member is fixedly attached to at least one elastic spacer member that has elastic mechanical properties in a specified direction. If a mechanical load is applied to the capacitive sensor member in the specified direction that is equal to or larger than a predetermined value for the mechanical load, the at least one electrically conductive bridging member provides at least one galvanic contact between the first electrically conductive antenna member and the second electrically conductive antenna member.

11 Claims, 4 Drawing Sheets

(51) Int. Cl.
  *H03K 17/955* (2006.01)
  *H03K 17/975* (2006.01)
  *B60N 2/00* (2006.01)
(52) U.S. Cl.
  CPC ......... *H03K 17/955* (2013.01); *H03K 17/975* (2013.01); *B60Q 2300/22* (2013.01); *G01R 27/26* (2013.01); *G01R 27/2605* (2013.01)
(58) Field of Classification Search
  CPC ......... G01N 27/62; G01N 27/64; H01J 41/00; H01J 41/02
  USPC ... 324/76.11–76.83, 459, 600, 649, 658, 686
  See application file for complete search history.

(56) References Cited

U.S. PATENT DOCUMENTS

| | | | |
|---|---|---|---|
| 2002/0038947 A1 | 4/2002 | Baba et al. | |
| 2006/0219460 A1* | 10/2006 | Wanami | B60R 21/01532 180/273 |
| 2011/0074447 A1* | 3/2011 | Ootaka | B60N 2/002 324/679 |
| 2016/0041113 A1* | 2/2016 | Pagani | G01N 17/04 324/694 |
| 2016/0169990 A1* | 6/2016 | Lips | G01R 33/34007 324/322 |
| 2018/0037137 A1* | 2/2018 | Goedert | B60N 2/5685 |
| 2018/0319365 A1* | 11/2018 | Derieux | B60N 2/002 |

FOREIGN PATENT DOCUMENTS

| | | |
|---|---|---|
| JP | 2006327220 A | 12/2006 |
| JP | 2015006817 A | 1/2015 |
| WO | WO2008138870 A1 | 11/2008 |

OTHER PUBLICATIONS

Written Opinion on International application No. PCT/EP2017/050808, dated Jan. 15, 2017, 6 pages.

* cited by examiner

CAPACITIVE OCCUPANT CLASSIFICATION SENSOR WITH LOAD-DEPENDENT ANTENNA AREA

TECHNICAL FIELD

The present invention generally relates to a capacitive sensor member of a vehicle seat occupant detection and classification device, a vehicle seat occupant detection and classification device comprising such capacitive sensor member and a vehicle seat including such vehicle seat occupant detection and classification device.

BACKGROUND OF THE INVENTION

Vehicle seat occupancy detection systems are nowadays widely used in vehicles, in particular in passenger cars, for providing a seat occupancy signal for various appliances, for instance for the purpose of a seat belt reminder (SBR) system or an activation control for an auxiliary restraint system (ARS). Seat occupancy detection systems include seat occupancy sensors that are known to exist in a number of variants, e.g. based on capacitive sensing, on deformation sensing or on sensing of pressure/force. In order to meet requirements regarding easy integration and field robustness, weight-sensitive seat occupancy sensors have typically been arranged on the B-surface of a vehicle seat, i.e. between a foam body of a seat cushion and a seat pan or cushion-supporting springs of the vehicle seat.

Further, vehicle seat occupancy detection systems are known to be employed as a means of assessing a potential activation of an installed vehicle passenger restraint system, such as an airbag.

Vehicle capacitive detection systems comprising capacitive sensors operated in loading mode are also used for the purpose of detection of vehicle seat occupancy. The capacitive sensors may be designed as sense-only capacitive sensors having a single sense electrode. Alternatively, they may be designed as guard-sense capacitive sensors, having a sense electrode and a guard electrode proximally arranged and mutually insulated from each other.

It is further known in the art to combine capacitive sensors and weight-sensitive sensors in vehicle seat occupancy detecting systems.

By way of example, U.S. Pat. No. 7,180,306 B2 describes an occupant detection system that includes a weight sensor and an electric field sensor, each operatively coupled to a seat. The electric field sensor generates an electric field from at least one electrode in the bottom of the seat, provides for generating a response to the influence of the occupant, and is adapted to discriminate the response of a seated infant or child seating condition from another seating condition. If a measure of weight from the weight sensor is less than a threshold, or if a child seating condition is detected by the electric field sensor, then a signal processor provides for disabling an associated restraint actuator. The electric field sensor may include a plurality of electrodes over first and second regions of differing proximity to a seated infant or child, or at least one electrode in cooperation with a shield or void over at least one of the regions.

Another occupant detecting apparatus with combined sensors for detecting an occupant seated on the passenger seat of a vehicle is described in patent application US 2002/0038947 A1. The occupant detecting apparatus comprises a plurality of electric field sensors provided in a bottom part and a rear part of the seat, and also a mechanical load sensor and an acceleration sensor. The electric field sensors are connected to a control unit comprising a high frequency oscillator, a resistor, a voltage buffer and a detector. Antenna electrodes are selected by the selectors and connected between the resistor and a voltage buffer. An analog-to-digital converter performs an analog-to-digital conversion on output signals of the selected electric field sensors. Digital output signals of the electric field sensors, the mechanical load sensor and the acceleration sensor are connected to a central processing unit, which determines a seat occupancy based on the sensor output signals, following predetermined criteria.

In another prior art solution, disclosed in document EP 2 062 789 A1, an occupant detection system for a vehicle seat combines a capacitance based occupation sensor and a weight based occupation sensor. The capacitance based sensor comprises an antenna arrangement, and delivers an occupancy signal corresponding to an occupation of the seat by an adult. The weight based occupation sensor is a switch sensor integrated inside the antenna arrangement of the capacitance based sensor. The switch sensor also delivers an occupancy signal in the event of an occupation of the vehicle seat by an adult. The occupant detection system further comprises a controller that sends an error message when occupancy is found by the weight based sensor and not by the capacitance based sensor.

A shortcoming in the use of vehicle seat occupant detection and classification devices that are based on capacitive sensor members only is an inability to correctly classify a seat occupancy in the case of vehicle-grounded objects being placed on the seat, for instance an electric device that is connected to vehicle ground via a charging cable, or a child restraint seat (CRS, such as ISOFIX) that is grounded by hooks that are mechanically connected to a vehicle body. The vehicle seat occupant detection and classification device is based on measurements of a physical quantity, for instance an electric current through the capacitive sensor member or a complex impedance or admittance of the capacitive sensor member, wherein the physical quantity is representative of an electric field between the capacitive sensor and the vehicle body. The vehicle body is electrically connected to a vehicle ground. The capacitive sensor member may be positioned on or inside the vehicle seat. A seat occupant or an object which is placed on the seat will modify the electric field, resulting in a change of the physical quantity. In this way, an object that is connected to ground may lead to a misclassification by the vehicle seat occupant detection and classification device, due to a relatively small distance between the capacitive sensor member and the grounded object.

Vehicle seat occupant detection and classification devices based on mechanical load sensors can operate well in a presence of an ISOFIX CRS or a grounded electrical device. These objects are not putting a high weight on the seat. Compared to a load-based resistive measurement, a capacitive measurement has the advantages of a simpler wiring and a stable and reproducible measurement over an entire temperature range as specified in common vehicle requirements.

The necessity of employing mechanical load sensors to fill the above-described information gap increases an effort in hardware, complexity and costs for such vehicle seat occupation detection and classification devices.

SUMMARY

It is therefore desirable to provide a vehicle seat occupant detection system that is able to reliably and correctly classify a seat occupancy without the above described shortcomings.

In one aspect of the present invention, the object is achieved by a capacitive sensor member of a vehicle seat occupant detection and classification device, wherein the capacitive sensor member comprises

- a first electrically conductive antenna member that is electrically connectable to a capacitance measurement circuit for determining a capacitance of the capacitive sensor member,
- at least a second electrically conductive antenna member that is adjacently arranged to the first electrically conductive antenna member without any mutual galvanic connection,
- at least one electrically conductive bridging member that is arranged to partially overlap the first electrically conductive antenna member and the second electrically conductive antenna member in a specified direction, and
- at least one elastic spacer member that has elastic mechanical properties at least in the specified direction.

The at least one electrically conductive bridging member is fixedly attached to the at least one elastic spacer member. The first electrically conductive antenna member and the second electrically conductive antenna member remain galvanically separated from each other if a mechanical load is applied to the capacitive sensor member in the specified direction that is lower than a predetermined value for the mechanical load.

Further, the at least one electrically conductive bridging member provides at least one galvanic contact between the first electrically conductive antenna member and the second electrically conductive antenna member if a mechanical load is applied to the capacitive sensor member in the specified direction that is equal to or larger than the predetermined value for the mechanical load.

The term "overlap in a direction", as used in this application, shall be understood as an overlap of two objects as seen in this direction.

The seat occupant classification may comprise at least two classes selected out of a group formed by classes "empty", "child" and "adult".

The term "electrically connectable", as used in this application, shall be understood to encompass galvanic electrical connections as well as connections established by capacitive and/or inductive electromagnetic coupling. The term "galvanic contact", as used in this application, shall particularly be understood as an electrical contact that is able to conduct a direct current (DC). In the same sense, the term "galvanically separated", as used in this application, shall particularly be understood to not conduct a direct current (DC) between galvanically separated objects.

The term "elastic", as used in this application, shall particularly be understood as the property of showing a reversible deformation when an external force is applied, and shall include reversible deformation according to linear and non-linear stress-strain behavior, such as for rubber.

The term "fixedly attached", as used in this application, shall particularly be understood such that an object moves in the same way as a moved object that is fixedly attached to it, and vice versa.

It is noted herewith that the terms "first", "second", etc. are used for distinction purposes only and are not meant to indicate or anticipate a sequence or a priority in any way.

The predetermined value for the mechanical load can be selected such that an adult seat occupant will cause the at least one electrically conductive bridging member to provide a galvanic contact between the first electrically conductive antenna member and the second electrically conductive antenna member. By that, a total sensitive antenna member area is increased, resulting in a larger measurement value of the capacitance measurement circuit.

An electric device, placed on the seat cushion and connected to vehicle ground, will not cause the at least one electrically conductive bridging member to provide a galvanic contact between the first electrically conductive antenna member and the second electrically conductive antenna member. Similarly, by adequately arranging the bridging members, an ISOFIX CRS will not trigger the bridging members due to the CRS's low weight distribution. By that, the total sensitive antenna member area will be the one of the first electrically conductive antenna member, resulting in a smaller measurement value of the capacitance measurement circuit.

Due to the force-dependent sensitive antenna member area, the capacitive sensor member therefore enables to distinguish between an adult seat occupant and, for instance, an electric device connected to vehicle ground or a ISOFIX CRS that is placed on the seat cushion.

The embodiments described herein are based on the insight that grounded electrical devices and ISOFIX CRS could lead to a high capacitance value, but always have a low weight distribution, i.e. low values of surface pressure that is applied to the capacitive sensor member. Belted CRS are usually not connected to ground and thus have low capacitance values. But these belted CRS could lead to large surface pressures. This means that a belted CRS may cause the at least one electrically conductive bridging member to provide a galvanic contact between the first electrically conductive antenna member and the second electrically conductive antenna member. Due to the low capacitance values this is however not problematic. Large capacitance values in combination with large values of surface pressure are unique for adult seat occupants. These criteria are exploited for enabling the desired distinction of seat occupancy. The capacitive measurement is focused on areas with high surface pressure, and there is no need to independently sense mechanical load and capacitance.

Capacitance measurement circuits for determining the capacitance of the capacitive sensor member are known in the art in a large number of variations and shall therefore not described in more detail herein. Any capacitance measurement circuit that appears to be suitable to the person skilled in the art may be employed.

The term "determining a capacitance", as used in this application, shall be understood to encompass an absolute measurement of a capacitance value as well as a measurement of a capacitance value relative to an arbitrarily determined capacitance zero.

Preferably, the at least one capacitive sensor is operated in loading mode. The term "loading mode", as used in this application, shall be understood particularly as a mode of measuring a displacement current caused by the presence of a grounded object in proximity of a single sense electrode (cf. J. Smith et al., Electric field sensing for graphical interfaces, IEEE Comput. Graph. Appl., 18(3):54-60, 1998). In general, it is also contemplated to operate the at least one capacitive sensor in transmit mode or in shunt mode in some embodiments. Both these modes are also described in the above-mentioned article, which shall hereby be incorporated by reference.

In a preferred embodiment of the capacitive sensor member, at least one out of the first electrically conductive antenna member and the second electrically conductive antenna member has a planar design and is arranged on and is attached to a planar surface of an electrically insulating carrier member. In this way, a simple design of the capacitive sensor member can be accomplished.

If at least one out of the first electrically conductive antenna member and the second electrically conductive antenna member is formed as an electrically conductive strip that is fixedly attached onto a surface of an electrically insulating substrate, a reliable and cost-effective embodiment of the capacitive sensor member with low manufacturing tolerance margins can be provided.

In some embodiments, the electrically insulating substrate can be formed by a printed circuit board substrate, and the first electrically conductive antenna member and the second electrically conductive antenna member are formed out of conducting layers, e.g. metal layers, laminated to the printed circuit board substrate, for instance by employing an etching process. In other embodiments, the electrically insulating substrate can be formed by a polymer sheet or foil, and the first electrically conductive antenna member and the second electrically conductive antenna member are formed of conductive material, e.g. a conductive graphite material or a metal or a conductive polymer, deposited or printed onto the substrate.

In another preferred embodiment of the capacitive sensor member, an area that is encompassed by the second electrically conductive antenna member comprises an area that is encompassed by the first electrically conductive antenna member. The term "area encompassed by an object", as used in this application, shall particularly be understood as an area of the smallest regular polygon that completely covers the object in the specified direction. In this way, a compact design of the capacitive sensor member can be achieved.

In yet another preferred embodiment, the capacitive sensor member further comprises a third electrically conductive antenna member that is adjacently arranged without any galvanic connection to the first electrically conductive antenna member and the second electrically conductive antenna member.

The first electrically conductive antenna member forms a single loop. An area that is encompassed by the second electrically conductive antenna member comprises an area that is encompassed by the first electrically conductive antenna member. An area that is encompassed by the first electrically conductive antenna member comprises an area that is encompassed by the third electrically conductive antenna member.

The first electrically conductive antenna member and the third electrically conductive antenna member remain galvanically separated from each other if a mechanical load is applied to the capacitive sensor member in the specified direction that is lower than the predetermined value for the mechanical load.

The at least one electrically conductive bridging member provides at least one galvanic connection/contact between the first electrically conductive antenna member and the third electrically conductive antenna member if a mechanical load is applied to the capacitive sensor member in the specified direction that is equal to or larger than the predetermined value for the mechanical load. In this way, a very compact design of the capacitive sensor member with a large difference between a total sensitive antenna area at an applied mechanical load below the predetermined value and a total sensitive antenna area at an applied mechanical load equal to or larger than the predetermined value can be accomplished.

In some embodiments, the single loop formed by the first antenna member can have elliptical, in particular circular shape, or may have rectangular, in particular square shape.

In another preferred embodiment, the capacitive sensor member comprises
- a plurality of second electrically conductive antenna members that are arranged in a plane and are arranged adjacently to the first electrically conductive antenna member without any mutual galvanic connection and without galvanic connection to the first electrically conductive antenna member,
- a plurality of electrically conductive bridging members, each of which is arranged to partially overlap the first electrically conductive antenna member and at least one out of the second electrically conductive antenna members in the specified direction, and
- a plurality of elastic spacer members that have elastic mechanical properties at least in the specified direction.

Each one out of the plurality of electrically conductive bridging members is fixedly attached to one out of the plurality of elastic spacer members.

The first electrically conductive antenna member and a specific one out of the plurality of second electrically conductive antenna members that are partially overlapped by a specific one out of the plurality of electrically conductive bridging members remain galvanically separated from each other if a mechanical load lower than a specific predetermined value for the mechanical load is applied in the specified direction to the specific one out of the plurality of elastic spacer members to which the specific one out of the plurality of electrically conductive bridging members is fixedly attached.

The specific one out of the plurality of electrically conductive bridging members provides at least one galvanic contact between the first electrically conductive antenna member and the specific one out of the plurality of second electrically conductive antenna members it is partially overlapping if a mechanical load equal to or larger than the specific predetermined value for the mechanical load is applied in the specified direction to the specific one out of the plurality of elastic spacer members to which the specific one out of the plurality of electrically conductive bridging members is fixedly attached.

In this way, the capacitive measurement is focused on areas with high surface pressure. It is unnecessary to measure applied mechanical load and capacitance independently to avoid misclassification of objects such as ISOFIX CRS and electronic devices that are connected to ground. It will be noted that depending on the configuration and arrangement of the plurality of second electrically conductive antenna members and the corresponding bridging members, a CRS could activate some of the secondary antenna members, but will never activate all bridging members.

The advantage of this system is as follows: CRS have either a high weight distribution or a high capacity. Belted CRS are usually not connected to ground, so they have a low capacity. But they have a high weight and will activate some or all bridging members. ISOFIX CRS can have a high capacity due to the ground connection, but they are fixed by the ISOFIX hooks, so they have a low weight distribution and will only cause very few bridging members to bridge. Thus the sensitivity of the capacitive sensor member is automatically tuned by the activation of the bridging members so as to be able to discriminate adult seat occupants from ISOFIX CRS seats.

In some preferred embodiments, the capacitive sensor member further comprises an electrically conductive guard electrode that is proximally arranged and mutually galvanically insulated from the first electrically conductive antenna member, the second electrically conductive antenna member or the plurality of second electrically conductive antenna members and, if applicable, the third electrically conductive antenna member. The electrically conductive guard electrode, in the specified direction, substantially overlaps the area encompassed by any one of the first electrically conductive antenna member, the second electrically conductive antenna member or the plurality of second electrically conductive antenna members and, if applicable, the third electrically conductive antenna member.

In this way, a capacitive sensor member can be provided that can be employed as a capacitive guard-sense sensor member. The technique of "guarding" is well known in the art and is frequently used for intentionally masking, and thus shaping, a sensitivity regime of a capacitive sensor member. To this end, the capacitance measurement circuit is configured to keep the guard electrode at the same electric potential as the first electrically conductive antenna member.

In another aspect of the invention, a vehicle seat occupant detection and classification device is provided that comprises at least one embodiment of the disclosed capacitive sensor member, a capacitance measurement circuit for determining a capacitance of the capacitive sensor member, and an evaluation unit that is configured to receive an output signal from the capacitance measurement circuit and to provide a seat occupant classification based on a level of the received output signal and at least one pre-determined threshold value of the output signal.

In this way, the benefits provided by the disclosed capacitive sensor member as well apply to the vehicle seat occupant detection and classification device.

In a further aspect of the invention, a vehicle seat is provided that comprises a seat structure for erecting the vehicle seat on a passenger cabin floor of the vehicle, a seat cushion having at least one seat foam member, a seat base supported by the seat structure and configured for receiving the seat cushion, the seat base and the seat cushion being provided for supporting a bottom of a seat occupant, a backrest that is provided for supporting a back of the seat occupant, and an embodiment of the disclosed vehicle seat occupant detection and classification system.

In this way, the benefits provided by the disclosed capacitive sensor member as well apply to the vehicle seat.

BRIEF DESCRIPTION OF THE DRAWINGS

Further details and advantages of the present invention will be apparent from the following detailed description of not limiting embodiments with reference to the attached drawing, wherein.

DESCRIPTION OF PREFERRED EMBODIMENTS

In the following, embodiments of capacitive sensor members in accordance with the invention are disclosed. The individual embodiments are described with reference to a particular figure and are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, the description of a preceding embodiment shall be referred to in lieu thereof.

Figure 1:
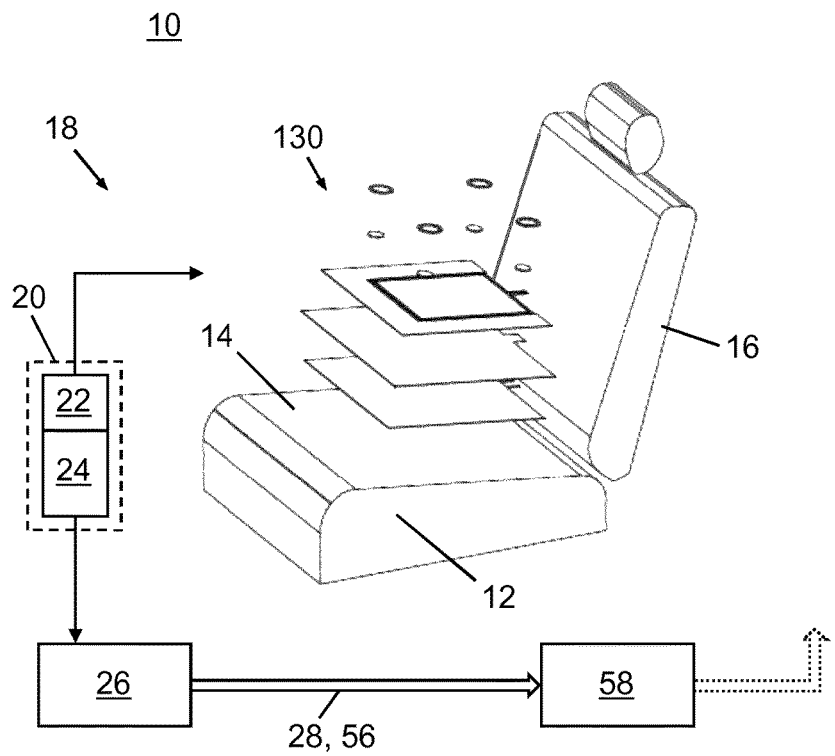
FIG. 1 in a combined perspective and partially exploded view schematically illustrates a vehicle seat and a vehicle seat occupant detection and classification device comprising a capacitive sensor member in accordance with an embodiment of the invention.

FIG. 1 (not to scale) schematically illustrates a vehicle seat 10 with an installed vehicle seat occupant detection and classification device 18 comprising a capacitive sensor member 130 in accordance with an embodiment of the invention, in a combined perspective and partially exploded view.

The vehicle seat 10 is formed by a seat of a passenger car and includes a seat structure (not shown) by which it is erected on a passenger cabin floor of the passenger car, as is well known in the art. The vehicle seat 10 further includes a seat base supported by the seat structure and configured for receiving a seat cushion 12 for providing comfort to a seat occupant. The seat cushion 12 of the vehicle seat 10 comprises a seat foam member and a fabric cover which has been omitted in FIG. 1. The seat base and the seat cushion 12 are provided for supporting a bottom of the seat occupant. A backrest 16 of the vehicle seat 10 is provided for supporting a back of the seat occupant.

The seat cushion 12 includes a top surface (A-surface 14) and a bottom surface (B-surface). The seat base has a top surface for receiving the seat cushion 12 such that the B-surface of the seat cushion 12 is in mechanical contact with the seat base top surface. A rear edge of the seat cushion 12 is proximal to the backrest 16, and a front edge of the cushion 12, which is provided to support a lower thigh region of an adult seat occupant, is distal to the backrest 16.

The vehicle seat occupant detection and classification device 18 includes the capacitive sensor member 130, a capacitance measurement circuit 20 for determining a capacitance of the capacitive sensor member 130, and an evaluation unit 26. The capacitive sensor member 130 is located on the A-surface 14 of the seat cushion 12, underneath the fabric cover. The capacitance measurement circuit 20 and the evaluation unit 26 are installed in the vehicle, remote from the vehicle seat 10.

The capacitance measurement circuit 20 includes a signal generating unit 22 for generating a periodic time-dependent signal that is to be applied to the capacitive sensor member 130 and a sensing circuit 24 for sensing a physical quantity that is indicative of a capacitance of the capacitive sensor member 130.

The evaluation unit 26 is configured to receive an output signal from the capacitance measurement circuit 20 that is indicative of a capacitance of the capacitive sensor member 130 as an input signal, and is configured to provide a seat occupant classification based on a level of the received input signal and two distinct pre-determined threshold values for the input signal. The seat occupant classification includes the occupancy classes "empty", "child" and "adult". The evaluation unit 26 is further configured to generate an output signal 28 that is indicative of a seat occupancy classification. The output signal 28 generated by the evaluation unit 26 is provided to an airbag control unit 58 of the vehicle via a CAN communication link 56 for the purpose of air bag activation control. For instance, if the transferred output signal 28 represents the occupancy class "adult", an airbag of the vehicle seat 10 will be deployed.

Figure 2:
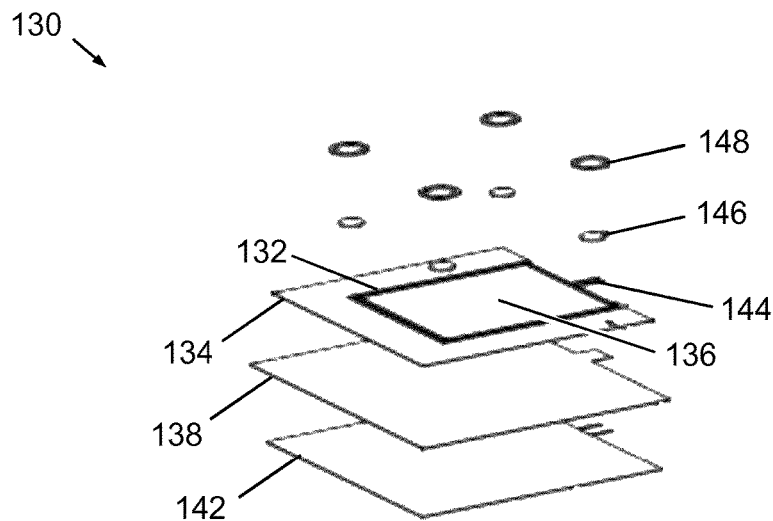
FIG. 2 schematically shows details of the capacitive sensor member pursuant to FIG. 1 in an exploded view.
Figure 3A:
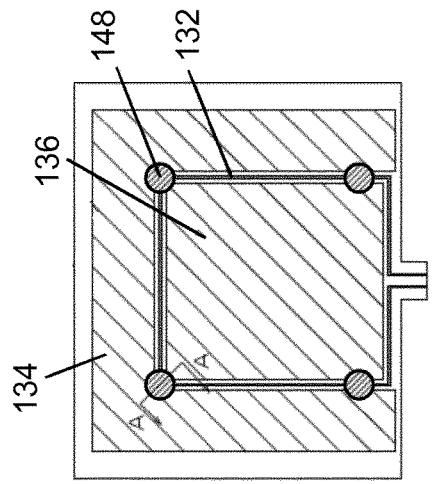
FIG. 3a is a schematic plan view of the capacitive sensor member pursuant to FIGS. 1 and 2 in a mechanically unloaded state.
Figure 3B:
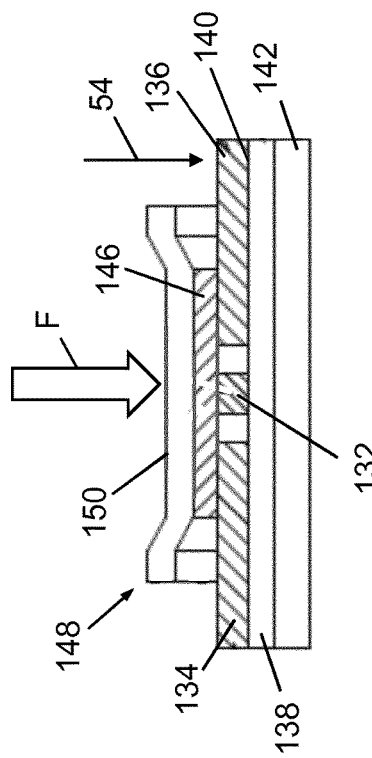
FIG. 3b is a schematic cross-sectional view of a detail of the capacitive sensor member in the mechanically unloaded state.

Referring now to FIGS. 2, 3a and 3b, the capacitive sensor member 130 comprises a first electrically conductive antenna member 132, a second electrically conductive antenna member 134 and a third electrically conductive antenna member 136. The first electrically conductive antenna member 132, the second electrically conductive antenna member 134 and the third electrically conductive antenna member 136 have a planar design and are arranged on and are attached to a planar surface of an electrically insulating carrier member 138.

The first electrically conductive antenna member 132 is formed by a narrow (in comparison to a lateral extension of the electrically conductive antenna member) metal strip that is shaped as a single rectangular loop and comprises two connection terminals 144 at ends of the loop by which it is electrically connected to the capacitance measurement circuit 20. The second electrically conductive antenna member 134 is formed as a U-shaped metal strip and is adjacently arranged to the first electrically conductive antenna member 132 such that the open side of the U is directed towards the two connection terminals 144 of the first electrically conductive antenna member 132. The third electrically conductive antenna member 136 is formed as a rectangular piece of metal sheet that is adjacently arranged to both the first electrically conductive antenna member 132 and the second electrically conductive antenna member 134 such that the single loop of the first electrically conductive antenna member 132 almost completely surrounds the third electrically conductive antenna member 136, and the rectangular piece of metal sheet forming the third electrically conductive antenna member 136 is arranged inside the U-shape of the second electrically conductive antenna member 134.

Hence, an area that is encompassed by the second electrically conductive antenna member 134 comprises an area that is encompassed by the first electrically conductive antenna member 132, which in turn comprises an area that is encompassed by the third electrically conductive antenna member 136, resulting in a compact footprint of the capacitive sensor member 130.

As can best be recognized from FIGS. 3a and 3b, the first electrically conductive antenna member 132, the second electrically conductive antenna member 134 and the third electrically conductive antenna member 136 do not comprise any mutual galvanic connection.

The first electrically conductive antenna member 132, the second electrically conductive antenna member 134 and the third electrically conductive antenna member 136 are readily formed by applying an electrically conductive material onto a top surface 140 of the electrically insulating carrier member 138 which is formed as an electrically insulating substrate designed as a polyethylene terephthalate (PET) sheet. The bottom surface of the electrically insulating carrier member 138 is equipped with an electrically conductive layer that is applied to the PET sheet, and that is configured to serve as a guard electrode 142. The electrically conductive material, e.g. a metal or a graphite material or an electrically conductive polymer, of the antenna members and/or the guard electrode may e.g. be applied onto the substrate by printing, depositing, laminating or any other suitable application technique.

The guard electrode 142 is proximally arranged and mutually galvanically insulated from the first electrically conductive antenna member 132, the second electrically conductive antenna member 134 and the third electrically conductive antenna member 136. The electrically conductive guard electrode 142, in a specified direction 54, which is arranged towards and perpendicular to the top surface 140 of the electrically insulating carrier member 138, substantially overlaps the area encompassed by any one of the first electrically conductive antenna member 132, the second electrically conductive antenna member 134 and the third electrically conductive antenna member 136.

Moreover, the capacitive sensor member 130 comprises four electrically conductive bridging members 146, each of which is arranged to partially overlap the first electrically conductive antenna member 132, the second electrically conductive antenna member 134 and the third electrically conductive antenna member 136 in the specified direction 154.

To this end, each one of the electrically conductive bridging members 146 is formed as a circular metal ring that is arranged, with regard to a direction opposite to the specified direction 54, above one corner of the four corners of the single electrically conductive loop of the first electrically conductive antenna member 132. Each one of the electrically conductive bridging members 146 is fixedly attached to one of four identically designed elastic spacer members 148 of the capacitive sensor member 130. Each one of the four elastic spacer members 148, which are made from electrically non-conductive PET, is designed to have a traverse member 150 comprising an upper surface and a lower surface, both of which are arranged substantially in parallel to the top surface 140 of the electrically insulating carrier member 138. The lower surface is arranged to face the electrically insulating carrier member 138. One electrically conductive bridging member 146 each is fixedly attached to the lower surface of the traverse member 150 of each elastic spacer member 148. Further, each elastic spacer member 148 comprises one stud 152 each integrally formed at each end of the traverse member 150 and protruding perpendicularly from the traverse member 150 towards the electrically insulating carrier member 138. One stud 152 of each elastic spacer member 148 is attached to the second electrically conductive antenna member 134, and the other stud 152 of each elastic spacer member 148 is attached to the third electrically conductive antenna member 136, by means of an adhesive.

As shown in FIG. 3b for a mechanically unloaded state, in which no external force is applied in the specified direction 54, each one of the electrically conductive bridging members 146 is disposed in a spaced relationship to the first electrically conductive antenna member 132, the second electrically conductive antenna member 134 and the third electrically conductive antenna member 136.

The elastic spacer members 148 have elastic mechanical properties in the specified direction 54 and are able to reversibly deflect if an external force in the specified direction 54 is applied. If a mechanical load F is applied to the capacitive sensor member 130 in the specified direction 54, at least one of the electrically conductive bridging members 146 approaches the first electrically conductive antenna member 132, the second electrically conductive antenna member 134 and the third electrically conductive antenna member 136.

As long as the mechanical load F that is applied to the capacitive sensor member 130 in the specified direction 54 is lower than a predetermined value for the mechanical load F, which is selected substantially below a mechanical load F applied to the vehicle seat 10 by an electric device placed on the seat or by an ISOFIX child restraint seat, the first electrically conductive antenna member 132, the second electrically conductive antenna member 134 and the third electrically conductive antenna member 136 remain galvanically separated from each other. In this regime of the mechanical load F, the first electrically conductive antenna member 132, which is connected to the capacitance measurement circuit 20, is the only sensing part of the capacitive sensor member 130. An electronic device or, if the bridging members 146 are suitably arranged, an empty ISOFIX CRS, grounded to a vehicle body, for instance, and positioned on the seat cushion 12 of the vehicle seat 10 causes a mechanical load F on the bridging members 146 that falls within this regime. Thus, the output signal from the capacitance measurement circuit 20 that is indicative of a capacitance of the capacitive sensor member 130 will remain below the lower of the two pre-determined threshold values, and the evaluation unit 26 will generate an output signal 28 that is indicative of the seat occupancy classification "empty".

Figure 4A:
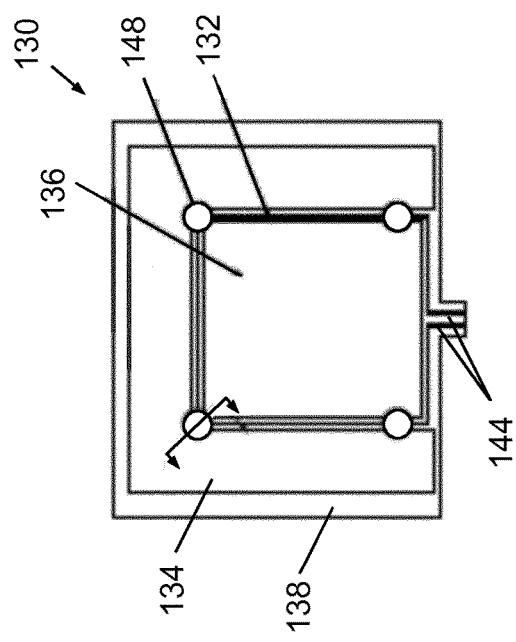
FIG. 4a is a schematic plan view of the capacitive sensor member pursuant to FIGS. 1 and 2 in a state of applying a mechanical force that is larger than a predetermined value.
Figure 4B:
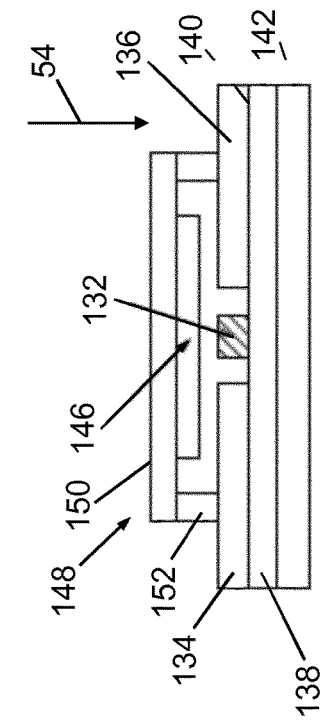
FIG. 4b is a schematic cross-sectional view of the detail of the capacitive sensor member in the state of applying a mechanical force that is larger than the predetermined value.

Once the mechanical load F that is applied to the capacitive sensor member 130 in the specified direction 54 is equal to or larger than the predetermined value for the mechanical load F, which will be the case if a child in a child seat or an adult is positioned on the seat cushion 12, at least one galvanic contact will be provided by the electrically conductive bridging members 146 between the first electrically conductive antenna member 132, the second electrically conductive antenna member 134 and the third electrically conductive antenna member 136. This situation is illustrated in FIGS. 4a and 4b. In this way, the second electrically conductive antenna member 134 and the third electrically conductive antenna member 136 are galvanically connected to the capacitance measurement circuit 20, as is the first electrically conductive antenna member 132.

In this regime of mechanical load F, the first electrically conductive antenna member 132, the second electrically conductive antenna member 134 and the third electrically conductive antenna member 136 become sensing parts of the capacitive sensor member 130. Thus, if the vehicle seat 10 is occupied by the child in the child seat, the output signal from the capacitance measurement circuit 20 that is indicative of a capacitance of the capacitive sensor member 130 will lie above the lower of the two pre-determined threshold values and below the larger of the two pre-determined threshold values, and the evaluation unit 26 will generate an output signal 28 that is indicative of the seat occupancy classification "child". Furthermore, if the vehicle seat 10 is occupied by the adult, the output signal from the capacitance measurement circuit 20 that is indicative of a capacitance of the capacitive sensor member 130 will lie above the upper of the two pre-determined threshold values and the evaluation unit 26 will generate an output signal 28 that is indicative of the seat occupancy classification "adult".

In this specific embodiment, as shown in FIG. 4a, it is the traverse member 150 that is configured to deflect upon applying the mechanical load F in the specified direction 54. However, in other embodiments, it is also contemplated to configure the studs 152 of the elastic spacer member 148 to deflect under the effect of mechanical load F, or to configure both the transverse member 150 and the studs 152 to deflect upon applying mechanical load F in the specified direction 54.

Figure 5:
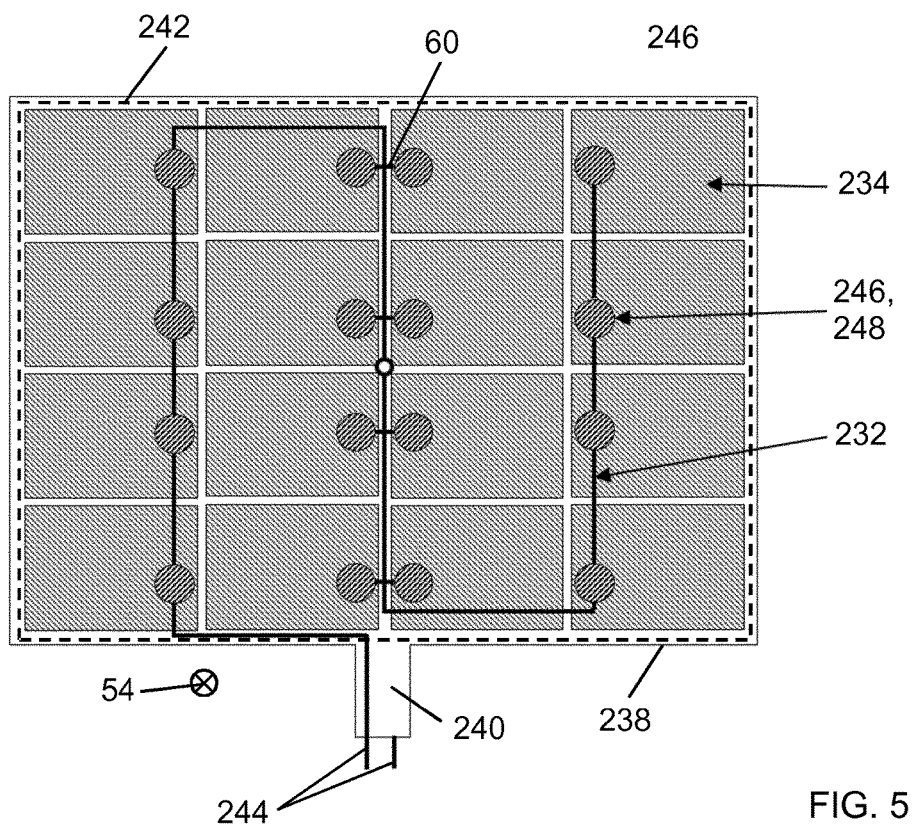
FIG. 5 is a schematic plan view of an alternative embodiment of a capacitive sensor member in accordance with the invention.

An alternative embodiment of a capacitive sensor member in accordance with the invention is schematically illustrated in a plan view in FIG. 5.

The capacitive sensor member 230 comprises a first electrically conductive antenna member 232 and a plurality of e.g. sixteen second electrically conductive antenna members 234. The first electrically conductive antenna member 232 and the second electrically conductive antenna members 234 of the plurality of second electrically conductive antenna members 234 have a planar design and are arranged on and are attached to a planar surface of an electrically insulating carrier member 238. It will be noted that the number of sixteen second electrically conductive antenna members 234 is given as a specific example only and that in other embodiments, the number of second electrically conductive antenna members 234 could be three or hundred or any other suitable number.

The first electrically conductive antenna member 232 is formed by a narrow (in comparison to a lateral extension of the electrically conductive antenna member) metal strip that is shaped in a meandering way and comprises two connection terminals 244 at ends of the meander by which it is electrically connectable to the capacitance measurement circuit 20 in a manner that is identical to the one shown in FIG. 1 for the first embodiment of the capacitive sensor member 130. One of the connection terminals 244 is connected to the meandering portion of the first electrically conductive antenna member 232 by a via in the electrically insulating carrier member 238. Along a middle portion, the first electrically conductive antenna member 232 comprises four pairs of stubs 60 that extend in a perpendicular and coplanar manner. The second electrically conductive antenna members 234 of the plurality of sixteen second electrically conductive antenna members 234 are identically formed as rectangular pieces of metal sheet, are arranged in a plane and are adjacently arranged to the first electrically conductive antenna member 232. The plurality of sixteen second electrically conductive antenna members 234 are adjacently arranged in a four by four array, resulting in a compact footprint of the capacitive sensor member 230.

In a mechanically unloaded condition the first electrically conductive antenna member 232 and the plurality of sixteen second electrically conductive antenna members 234 do not comprise any mutual galvanic connection.

The first electrically conductive antenna member 232 and the plurality of second electrically conductive antenna members 234 are readily formed by applying an electrically conductive material onto a top surface 240 of the electrically insulating carrier member 238, which is formed as an electrically insulating substrate designed as a polyethylene terephthalate (PET) sheet. The bottom surface of the electrically insulating carrier member 238 is equipped with an electrically conductive layer that is applied to the PET sheet, and that is configured to serve as a guard electrode 242. The electrically conductive material, e.g. a metal or a graphite material or an electrically conductive polymer, of the antenna members and/or the guard electrode may e.g. be applied onto the substrate by printing, depositing, laminating or any other suitable application technique.

The guard electrode 242 is proximally arranged and mutually galvanically insulated from the first electrically conductive antenna member 232 and the plurality of second electrically conductive antenna members 234. The electrically conductive guard electrode 242, in the specified direction 54, which is arranged towards and perpendicular to the top surface 240 of the electrically insulating carrier member 238, substantially overlaps the area encompassed by any one of the first electrically conductive antenna member 232 and the plurality of second electrically conductive antenna members 234.

Moreover, the capacitive sensor member 230 comprises a plurality of electrically conductive bridging members 246, each of which is arranged to partially overlap the first electrically conductive antenna member 232 and one second electrically conductive antenna member 234 out of the plurality of second electrically conductive antenna members 234 in the specified direction 54.

Each one of the electrically conductive bridging members 246 is similarly designed to the electrically conductive bridging members 146 of the first embodiment of the capacitive sensor member 130. Each one of the electrically conductive bridging members 246 is fixedly attached to one elastic spacer member 248 out of a plurality of elastic spacer members 248 of the capacitive sensor member 230. Each one of the elastic spacer members 248 is identically formed to the elastic spacer members 148 of the first embodiment of the capacitive sensor member 130 and has elastic mechanical properties in the specified direction 54.

The electrically conductive bridging members 246 are fixedly attached to the elastic spacer members 248 as described for the first embodiment of the capacitive sensor member 130.

The first electrically conductive antenna member 232 and a specific one out of the plurality of second electrically conductive antenna members 234 that are partially overlapped by a specific one out of the plurality of electrically conductive bridging members 246 remain galvanically separated from each other if a mechanical load F lower than a specific predetermined value for the mechanical load F is applied in the specified direction 54 to the specific one out of the plurality of elastic spacer members 248 to which the specific one out of the plurality of electrically conductive bridging members 246 is fixedly attached. In this regime of mechanical load F, the first electrically conductive antenna member 232 is the only sensing part of the capacitive sensor member 230.

If a mechanical load F is applied to the capacitive sensor member 230 in the specified direction 54, at least one out of the plurality of electrically conductive bridging members 246 approaches the first electrically conductive antenna member 232 and one out of the plurality of second electrically conductive antenna members 234.

The portion of the mechanical load F that is applied to the specific one out of the plurality of elastic spacer members 248 results in an individual surface pressure. For instance, the mechanical load F may have a non-homogeneous spatial distribution perpendicular to the specified direction 54.

If a mechanical load F equal to or larger than the specific predetermined value for the mechanical load F is applied in the specified direction 54 to the specific one out of the plurality of elastic spacer members 248 to which the specific one out of the plurality of electrically conductive bridging members 246 is fixedly attached, the specific one out of the plurality of electrically conductive bridging members 246 provides at least one galvanic contact between the first electrically conductive antenna member 232 and the specific one out of the plurality of second electrically conductive antenna members 234 it is partially overlapping. In this regime of mechanical load F, the first electrically conductive antenna member 232 and the specific one out of the plurality of second electrically conductive antenna members 234 become sensing parts of the capacitive sensor member 230. The more galvanic contacts are provided between the first electrically conductive antenna member 232 and the plurality of second electrically conductive antenna members 234, the larger the output signal of the capacitance measurement circuit 20 will be.

Figure 6:
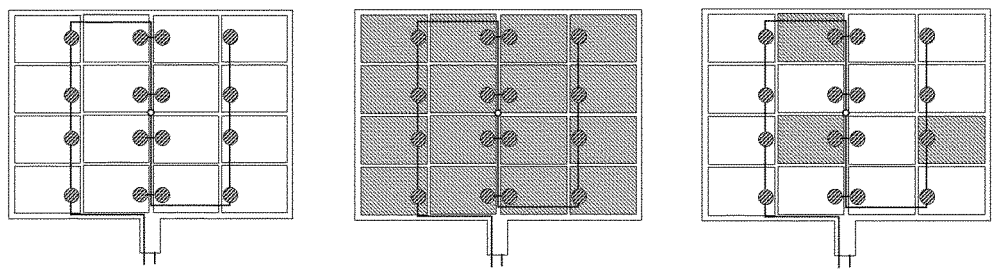
FIG. 6 illustrates sensing parts of the alternative embodiment of the capacitive sensor member pursuant to FIG. 5 in three different mechanical load situations.

FIG. 6 schematically illustrates sensing parts of the capacitive sensor member 230 in three different mechanical load situations:

surface pressure lower than any specific predetermined value for the elastic spacer members 248, first electrically conductive antenna member 232 is the only sensing part (left);

surface pressure larger than any specific predetermined value for the elastic spacer members 248, first electrically conductive antenna member 232 and the plurality of second electrically conductive antenna members 234 are sensing part (middle); and surface pressure larger than specific predetermined values of three of the elastic spacer members 248, first electrically conductive antenna member 232 and the highlighted three second electrically conductive antenna members 234 are sensing part of the capacitive sensor member 230 (right).

The specific predetermined values for the surface pressure for providing at least one galvanic contact between the first electrically conductive antenna member 232 and a specific one out of the plurality of second electrically conductive antenna members 234 it is partially overlapping may be equal or may be mutually different from each other, depending on a desired sensor response that may be specific to an expected spatial distribution of the applied mechanical load F.

Figure 7:
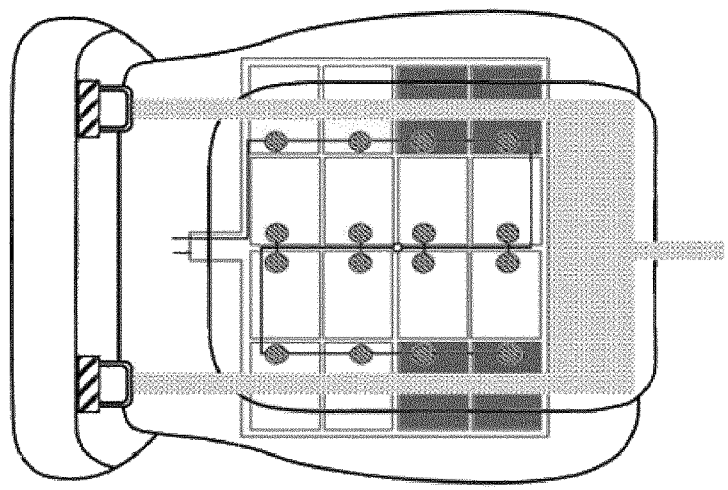
FIG. 7 illustrates the activation of the sensing parts of the capacitive sensor member pursuant to FIG. 5 for a seat occupied by an ISOFIX CRS.
Figure 8:
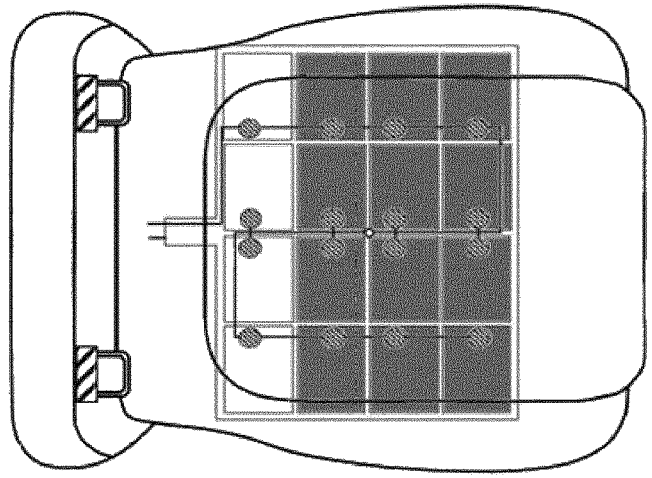
FIG. 8 illustrates the activation of the sensing parts of the capacitive sensor member pursuant to FIG. 5 for a seat occupied by a belted CRS.

FIGS. 7 and 8 schematically illustrate the difference of the activation of the sensing parts of the capacitive sensor member between a seat occupied by an ISOFIX CRS and a seat occupied by a belted CRS. Belted CRS are usually not connected to ground, so they have a low capacity. But they have a high weight and will activate some or all bridging members. This is schematically illustrated in FIG. 8.

In contrast to this ISOFIX CRS can have a high capacity because of the ground connection, but they are fixed by the ISOFIX hooks, so they have a low weight distribution and will only cause some of the bridging members to bridge. This is schematically illustrated in FIG. 7, where the mechanical footprint of the ISOFIX CRS is represented as a dotted surface.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitive sensor member of a vehicle seat occupant detection and classification device, the capacitive sensor member comprising:
   a first electrically conductive antenna member that is electrically connectable to a capacitance measurement circuit for determining a capacitance of the capacitive sensor member,
   at least a second electrically conductive antenna member that is adjacently arranged to the first electrically conductive antenna member without any mutual galvanic connection,
   at least one electrically conductive bridging member that is arranged to partially overlap the first electrically conductive antenna member and the second electrically conductive antenna member in a specified direction,
   at least one elastic spacer member that has elastic mechanical properties at least in the specified direction,
   wherein the at least one electrically conductive bridging member is fixedly attached to the at least one elastic spacer member,
   wherein the first electrically conductive antenna member and the second electrically conductive antenna member remain galvanically separated from each other if a mechanical load is applied to the capacitive sensor member in the specified direction that is lower than a predetermined value for the mechanical load, and
   wherein the at least one electrically conductive bridging member provides at least one galvanic contact between the first electrically conductive antenna member and the second electrically conductive antenna member if a mechanical load is applied to the capacitive sensor member in the specified direction that is equal to or larger than the predetermined value for the mechanical load.

2. The capacitive sensor member as claimed in claim 1, wherein at least one out of the first electrically conductive antenna member and the second electrically conductive antenna member has a planar design and is arranged on and is attached to a planar surface of an electrically insulating carrier member.

3. The capacitive sensor member as claimed in claim 1, wherein at least one out of the first electrically conductive antenna member and the second electrically conductive antenna member is formed as an electrically conductive strip that is fixedly attached onto a surface of an electrically insulating substrate.

4. The capacitive sensor member as claimed in claim 1, wherein an area that is encompassed by the second electrically conductive antenna member comprises an area that is encompassed by the first electrically conductive antenna member.

5. The capacitive sensor member as claimed in claim 1, further comprising a third electrically conductive antenna member that is adjacently arranged without any galvanic connection to the first electrically conductive antenna member and the second electrically conductive antenna member, wherein
   the first electrically conductive antenna member forms a single loop,
   an area that is encompassed by the second electrically conductive antenna member comprises an area that is encompassed by the first electrically conductive antenna member,
   an area that is encompassed by the first electrically conductive antenna member comprises an area that is encompassed by the third electrically conductive antenna member, and
   wherein the first electrically conductive antenna member and the third electrically conductive antenna member remain galvanically separated from each other if a mechanical load (F) is applied to the capacitive sensor member in the specified direction that is lower than the predetermined value for the mechanical load (F), and
   wherein the at least one electrically conductive bridging member provides at least one galvanic contact between the first electrically conductive antenna member and the third electrically conductive antenna member if a mechanical load (F) is applied to the capacitive sensor member in the specified direction that is equal to or larger than the predetermined value for the mechanical load (F).

6. The capacitive sensor member as claimed in claim 1, comprising
   a plurality of second electrically conductive antenna members that are arranged in a plane and are arranged adjacently to the first electrically conductive antenna member without any mutual galvanic connection and without galvanic connection to the first electrically conductive antenna member,
   a plurality of electrically conductive bridging members, each of which is arranged to partially overlap the first electrically conductive antenna member and at least one out of the plurality of second electrically conductive antenna members in the specified direction,
   a plurality of elastic spacer members that have elastic mechanical properties at least in the specified direction,
   wherein each one out of the plurality of electrically conductive bridging members is fixedly attached to one out of the plurality of elastic spacer members,
   wherein the first electrically conductive antenna member and a specific one out of the plurality of second electrically conductive antenna members that are partially overlapped by a specific one out of the plurality of electrically conductive bridging members remain galvanically separated from each other if a mechanical load lower than a specific predetermined value for the mechanical load is applied in the specified direction to the specific one out of the plurality of elastic spacer members to which the specific one out of the plurality of electrically conductive bridging members is fixedly attached, and
   wherein the specific one out of the plurality of electrically conductive bridging members provides at least one galvanic contact between the first electrically conductive antenna member and the specific one out of the plurality of second electrically conductive antenna members it is partially overlapping if a mechanical load equal to or larger than the specific predetermined value for the mechanical load is applied in the specified direction to the specific one out of the plurality of elastic spacer members to which the specific one out of the plurality of electrically conductive bridging members is fixedly attached.

7. The capacitive sensor member as claimed in claim 1, further comprising an electrically conductive guard electrode proximally arranged and mutually galvanically insulated from the first electrically conductive antenna member and the second electrically conductive antenna member or the plurality of second electrically conductive antenna members, wherein the electrically conductive guard electrode, in the specified direction, substantially overlaps the area encompassed by any one of the first electrically conductive antenna member and the second electrically conductive antenna member or the plurality of the second electrically conductive antenna members.

8. A vehicle seat occupant detection and classification device comprising:
   at least one capacitive sensor member as claimed in claim 1,
   a capacitance measurement circuit for determining a capacitance of the capacitive sensor member, and
   an evaluation unit that is configured to receive an output signal from the capacitance measurement circuit and to provide a seat occupant classification based on a level of the received output signal and at least one predetermined threshold value of the output signal.

9. A vehicle seat, comprising:
   a seat structure for erecting the vehicle seat on a passenger cabin floor of the vehicle,
   a seat cushion having at least one seat foam member,
   a seat base supported by the seat structure and configured for receiving the seat cushion, the seat base and the seat cushion being provided for supporting a bottom of a seat occupant,
   a backrest that is provided for supporting a back of the seat occupant, and
   a vehicle seat occupant detection and classification system as claimed in claim 8.

10. Use of the vehicle seat occupant detection and classification device as claimed in claim 8 in a vehicle seat that includes a seat base configured for taking up a seat cushion having at least one seat foam member, the seat base and the seat cushion being provided for supporting a bottom of a seat occupant, and a backrest that is provided for supporting a back of the seat occupant, wherein the at least one capacitive sensor member is arranged at one out of the seat cushion or the backrest.

11. Use of the capacitive sensor member as claimed claim 1 in a vehicle seat occupant detection and classification device that comprises:
   a capacitance measurement circuit for determining a capacitance of the capacitive sensor member, and
   an evaluation unit that is configured to receive an output signal from the capacitance measurement circuit and to provide a seat occupant classification based on a level of the received output signal and at least one predetermined threshold value of the output signal.

* * * * *